US012706355B2

(12) United States Patent
Jung et al.

(10) Patent No.: US 12,706,355 B2
(45) Date of Patent: Aug. 11, 2026

(54) BATTERY MODULE AND MANUFACTURING METHOD THEREOF

(71) Applicant: LG Energy Solution, Ltd., Seoul (KR)

(72) Inventors: Kitaek Jung, Daejeon (KR); Junyeob Seong, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 1661 days.

(21) Appl. No.: 17/058,294

(22) PCT Filed: Mar. 19, 2020

(86) PCT No.: PCT/KR2020/003799
§ 371 (c)(1),
(2) Date: Nov. 24, 2020

(87) PCT Pub. No.: WO2020/251143
PCT Pub. Date: Dec. 17, 2020

(65) Prior Publication Data
US 2021/0265707 A1 Aug. 26, 2021

(30) Foreign Application Priority Data
Jun. 11, 2019 (KR) ........................ 10-2019-0068577

(51) Int. Cl.
*H01M 50/519* (2021.01)
*H01M 50/209* (2021.01)
(Continued)

(52) U.S. Cl.
CPC ....... *H01M 50/519* (2021.01); *H01M 50/209* (2021.01); *H01M 50/264* (2021.01);
(Continued)

(58) Field of Classification Search
CPC ............. H01M 50/519; H01M 50/209; H01M 50/264; H01M 50/507; H01M 50/503
See application file for complete search history.

(56) References Cited

U.S. PATENT DOCUMENTS

2012/0231638 A1* 9/2012 Ikeda .................. H01M 50/502 439/77
2013/0236761 A1 9/2013 Seong et al.
(Continued)

FOREIGN PATENT DOCUMENTS

CN 103210522 A 7/2013
CN 104303333 A 1/2015
(Continued)

OTHER PUBLICATIONS

English translation of KR20170081901A (Year: 2017).*
(Continued)

*Primary Examiner* — Ula C Ruddock
*Assistant Examiner* — Sarika Gupta
(74) *Attorney, Agent, or Firm* — Lerner David LLP

(57) ABSTRACT

The present disclosure relates to a battery module having a connector for connecting a flexible printed circuit board, and a manufacturing method thereof. The battery module includes a battery cell stack in which a plurality of battery cells are stacked, first and second busbar frames formed respectively on front and rear surfaces of the battery cell stack, and a flexible printed circuit board connecting the first and second busbar frames. The flexible printed circuit board includes a first flexible printed circuit board part and a second flexible printed circuit board part which is distinct from the first flexible printed circuit board part, and the first flexible printed circuit board part and the second flexible printed circuit board part are connected to each other via a connector.

17 Claims, 4 Drawing Sheets

(51) Int. Cl.
*H01M 50/264* (2021.01)
*H01M 50/503* (2021.01)
*H01M 50/507* (2021.01)
*H05K 1/02* (2006.01)

(52) U.S. Cl.
CPC ....... *H01M 50/503* (2021.01); *H01M 50/507* (2021.01); *H05K 1/0277* (2013.01); *H05K 2201/10037* (2013.01); *H05K 2201/10272* (2013.01)

(56) References Cited

U.S. PATENT DOCUMENTS

| | | | |
|---|---|---|---|
| 2013/0302651 | A1 | 11/2013 | Kim et al. |
| 2014/0030556 | A1 | 1/2014 | Beer |
| 2015/0093615 | A1 | 4/2015 | Yoshioka |
| 2016/0336563 | A1 | 11/2016 | Choi et al. |
| 2017/0214009 | A1 | 7/2017 | Ha et al. |
| 2017/0279160 | A1 | 9/2017 | Kim |
| 2018/0108898 | A1 | 4/2018 | Shoji et al. |
| 2019/0001838 | A1 * | 1/2019 | Choi ....................... B60L 50/60 |
| 2019/0088912 | A1 | 3/2019 | Goh et al. |
| 2019/0348720 | A1 | 11/2019 | Oh et al. |
| 2019/0389318 | A1 | 12/2019 | Lee et al. |
| 2020/0014005 | A1 | 1/2020 | Lee et al. |
| 2020/0411832 | A1 | 12/2020 | Jin et al. |

FOREIGN PATENT DOCUMENTS

| | | | |
|---|---|---|---|
| JP | 2010198990 | A | 9/2010 |
| JP | 2010244894 | A | 10/2010 |
| JP | 2013218823 | A | 10/2013 |
| JP | 2013235828 | A | 11/2013 |
| JP | 5896813 | B2 | 3/2016 |
| JP | 2018067387 | A | 4/2018 |
| KR | 20130125334 | A | 11/2013 |
| KR | 20140063205 | A | 5/2014 |
| KR | 20150000090 | A | 1/2015 |
| KR | 101698765 | B1 | 1/2017 |
| KR | 20170081901 | A * | 7/2017 |
| KR | 20170110746 | A | 10/2017 |
| KR | 101806995 | B1 | 12/2017 |
| KR | 20180038253 | A | 4/2018 |
| KR | 20180099437 | A | 9/2018 |
| KR | 20190061378 | A | 6/2019 |
| KR | 20190063814 | A | 6/2019 |
| WO | 2018124494 | A2 | 7/2018 |
| WO | 2018159928 | A1 | 9/2018 |

OTHER PUBLICATIONS

Search Report dated Jul. 6, 2022 from the Office Action for Chinese Application No. 202080002942.7 issued Jul. 13, 2022, pp. 1-3.

Search report from International Application No. PCT/KR2020/003799, mailed Jun. 30, 2020.

* cited by examiner

PRIOR ART

PRIOR ART

FIG. 3

BATTERY MODULE AND MANUFACTURING METHOD THEREOF

CROSS-REFERENCE TO RELATED APPLICATIONS

This application is a national phase entry under 35 U.S.C. § 371 of International Application No. PCT/KR2020/003799, filed on Mar. 19, 2020, which claims the benefit of Korean Patent Application No. 10-2019-0068577 filed on Jun. 11, 2019 with the Korean Intellectual Property Office, the disclosures of which are each incorporated herein by reference in their entirety.

CROSS CITATION WITH RELATED APPLICATION(S)

This application claims the benefit of Korean Patent Application No. 10-2019-0068577 filed on Jun. 11, 2019 with the Korean Intellectual Property Office, the disclosure of which is incorporated herein by reference in its entirety.

TECHNICAL FIELD

The present invention relates to a battery module and a manufacturing method thereof, and more particularly, to a battery module having a connector for connecting a flexible printed circuit board and a manufacturing method thereof.

BACKGROUND ART

A secondary battery has attracted much attention as an energy source in various products such as a mobile device and an electric vehicle. The secondary battery is a potent energy resource that can replace the use of existing products using fossil fuels, and is in the spotlight as an environment-friendly energy source because it does not generate by-products due to energy use.

Recently, along with a continuous rise of the necessity for a large-capacity secondary battery structure, including the utilization of the secondary battery as an energy storage source, there is a growing demand for a battery pack of a multi-module structure which is an assembly of battery modules in which a plurality of secondary batteries are connected in series/parallel.

Meanwhile, when a plurality of battery cells are connected in series/parallel to configure a battery pack, it is common to configure a battery module composed of at least one battery cell, and to configure a battery pack by using at least one of the battery modules and adding other components.

The battery module includes a battery cell stack in which a plurality of battery cells are stacked, a busbar frame formed at each of both ends of the battery cell stack, and a flexible printed circuit board (FPCB) connecting the busbar frames at both ends.

FIG. 1 is a view showing a state in which a frame, a battery cell stack and a flexible printed circuit board are provided in a conventional battery module. FIG. 2 is an exploded perspective view of a flexible printed circuit board cover and a flexible printed circuit board in a conventional battery module.

Referring to FIGS. 1 and 2, conventionally, a battery cell stack 10, a busbar frame 30 and a flexible printed circuit board (FPCB) 40 were inserted and installed inside a hexahedron-shaped frame 20 with opened front and rear surfaces, and the front and rear surfaces of the frame 20 were covered by end plates 60. In this case, a flexible printed circuit board cover 50, to which the flexible printed circuit board 40 is attached, was hinge-assembled with each of the busbar frames 30 connected to both ends of the flexible printed circuit board cover 50, and the hinge-assembled busbar frame 30 and flexible printed circuit board cover 50 were seated on the battery cell stack 10, and then inserted and installed in the frame 20 together with the battery cell stack 10.

However, as shown in FIGS. 1 and 2, since the flexible printed circuit board 40 may be damaged when inserted into the frame 20, the flexible printed circuit board 40 had to be inserted and installed inside the frame 20 while being attached to the flexible printed circuit board cover 50, and there is a problem that a height of the battery module increases by 1.0 to 1.2 mm due to the flexible printed circuit board cover 50.

In addition, when the battery cell stack 10 and the busbar frame 30 are assembled through a hinge structure, the flexible printed circuit board cover 50 is seated on an upper portion of the battery cell stack 10, and then the busbar frame 30 at both ends may be installed so as to rotate around the hinge and come into contact with the front and rear surfaces of the battery cell stack 10. In this case, when the busbar frame 30 is rotated, there is a problem that interference may occur between the ends of electrode leads protruding from the front and rear surfaces of the battery cell stack 10 and the busbar frame 30 entering by rotation.

Moreover, when stacking the battery cell stack 10, if a cumulative tolerance occurs due to overlapping of a folding portion formed on the side of the battery cell, there is a problem that interference phenomenon may occur between the battery cells due to a narrow space resulting from the volume of the flexible printed circuit board cover 50.

DETAILED DESCRIPTION OF THE INVENTION

Technical Problem

Therefore, it is an object of the present disclosure to provide a battery module having a structure capable of securing a predetermined space in the module by removing a flexible printed circuit board cover, and at the same time, preventing damage when a flexible printed circuit board is installed, and a manufacturing method thereof.

Technical problems to be solved by the present disclosure are not limited to the aforementioned technical problem, and other technical problems, which are not mentioned above, may be clearly understood from the following descriptions by those skilled in the art to which the present disclosure pertains.

Technical Solution

According to one embodiment of the present disclosure for realizing the above object, there is provided a battery module comprising: a battery cell stack in which a plurality of battery cells are stacked, first and second busbar frames formed respectively on front and rear surfaces of the battery cell stack, and a flexible printed circuit board connecting the first and second busbar frames, wherein the flexible printed circuit board includes a first flexible printed circuit board part and a second flexible printed circuit board part which is distinct from the first flexible printed circuit board part, and the first flexible printed circuit board part and the second flexible printed circuit board part are connected to each other via a connector.

According to another embodiment of the present disclosure for realizing the above-described object, there is provided a method of manufacturing a battery module comprising the steps of: coupling a first busbar frame with a first flexible printed circuit board part and coupling a second busbar frame with a second flexible printed circuit board part; coupling the first and second busbar frames to front and rear surfaces of a battery cell stack, respectively; and connecting the first flexible printed circuit board part and the second flexible printed circuit board part via a connector.

The connector can be formed at the center of the flexible printed circuit board to connect the first flexible printed circuit board part and the second flexible printed circuit board part.

The connector can be formed at one of both ends of the flexible printed circuit board to connect the first flexible printed circuit board part and the second flexible printed circuit board part.

The battery cell stack may include a battery cell fixing part for fixing the plurality of battery cells in a vertical direction at the center and both ends of the battery cell stack.

The connector may be located on the battery cell fixing part.

The connector can be formed on each of the opposite ends of the first and second flexible printed circuit board parts to connect the first and second flexible printed circuit board parts.

In the step of coupling the first and second busbar frames to the battery cell stack, the first and second busbar frames may be coupled to the front and rear surfaces of the battery cell stack in a vertical direction, respectively.

In the step of coupling the first and second busbar frames with the first and second flexible printed circuit board parts, respectively, the first and second busbar frames may be coupled with the first and second flexible printed circuit board parts in a vertical direction, respectively.

A battery pack according to another embodiment of the present disclosure includes the battery module.

Advantageous Effects

In a battery module and a manufacturing method thereof according to one embodiment of the present disclosure, by applying a connector to the middle or edge of a flexible printed circuit board, a flexible printed circuit board cover can be removed, and damage to the flexible printed circuit board can be prevented during transportation of semi-finished products and in-line work.

In addition, in a battery module and a manufacturing method thereof according to one embodiment of the present disclosure, when assembling a busbar frame, it is not rotatably assembled by a hinge, but is assembled and installed in a direction perpendicular to front and rear surfaces of a battery cell stack, thereby making it possible to solve an interference problem between an electrode lead and an busbar frame that may occur during assembling.

Moreover, in a battery module and a manufacturing method thereof according to one embodiment of the present disclosure, since a deformation and separation phenomenon of a hinge is eliminated due to the non-application of a hinge structure, the workability of the manufacturing process can be improved.

Further, in a battery module and a manufacturing method thereof according to one embodiment of the present disclosure, since the installation of a flexible printed circuit board cover and the assembling process of a hinge are unnecessary, it is effective in reducing the manufacturing cost of a product.

In addition, in a battery module and a manufacturing method thereof according to one embodiment of the present disclosure, since a height of the battery module can be reduced due to the removal of a flexible printed circuit board cover, there is an advantage that a space efficiency can be secured and an energy density of the module itself can be improved.

The effects of the present disclosure are not limited to the effects mentioned above, and other effects not described above will be clearly understood by those skilled in the art from the description of the claims.

BRIEF DESCRIPTION OF THE DRAWINGS

FIG. 3 is a perspective view showing a battery module according to one embodiment of the present disclosure.

DETAILED DESCRIPTION OF THE EMBODIMENTS

It should be understood that the embodiments disclosed herein are illustrative only for better understanding of the present disclosure, and that the present disclosure may be modified in various ways.

However, in describing the present disclosure, when it is determined that the specific description of known functions and configurations unnecessarily obscures the subject matter of the present disclosure, the detailed description thereof will be omitted. In addition, to help understand the present disclosure, the accompanying drawings are not illustrated based on actual scales, but parts of the constituent elements may be exaggerated in size.

As used herein, terms such as first, second, and the like may be used to describe various components, and the terms are used only to discriminate one constituent element from another component.

Further, the terms used herein are used only to describe exemplary embodiments, and are not intended to limit the present disclosure. A singular expression includes a plural expression unless they have definitely opposite meanings in the context. It should be understood that the terms “comprise”, “include”, and “have” as used herein are intended to designate the presence of stated features, numbers, steps, constitutional elements, or combinations thereof, but it should be understood that they do not preclude a possibility of existence or addition of one or more other features, numbers, steps, constitutional elements, or combinations thereof.

Hereinafter, a battery module according to one embodiment of the present disclosure will be described with reference to FIGS. 3 and 4.

Figure 3:
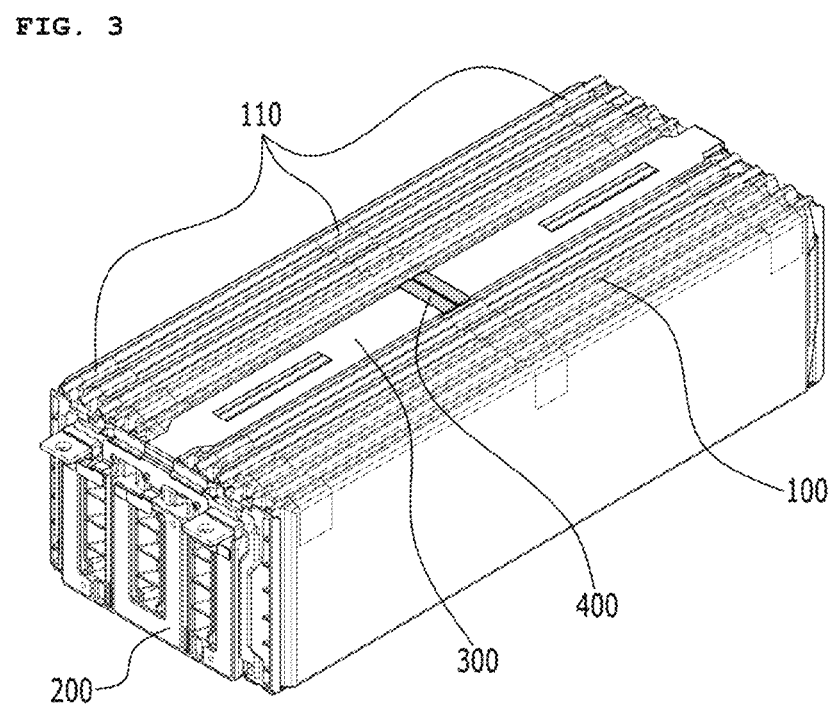

FIG. 3 is a perspective view showing a battery module according to one embodiment of the present disclosure. FIG. 4 is a perspective view showing a state before assembling the busbar frame and flexible printed circuit board of FIG. 3.

Figure 1:
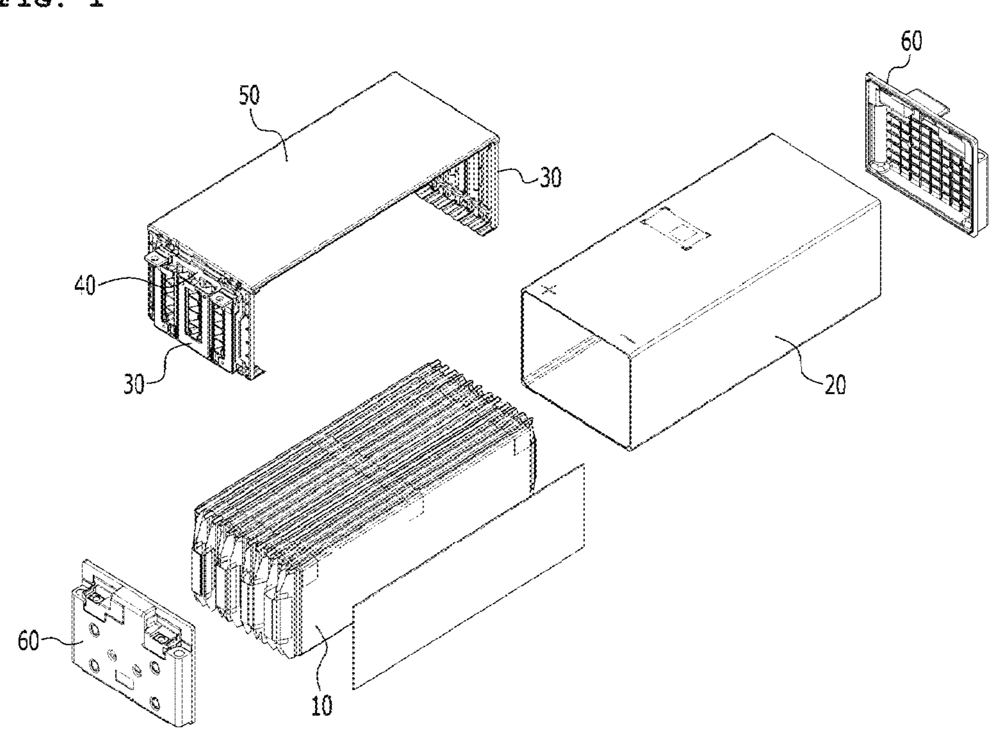
FIG. 1 is an exploded perspective view showing a state in which a frame, a battery cell stack and a flexible printed circuit board are provided in a conventional battery module.
Figure 2:
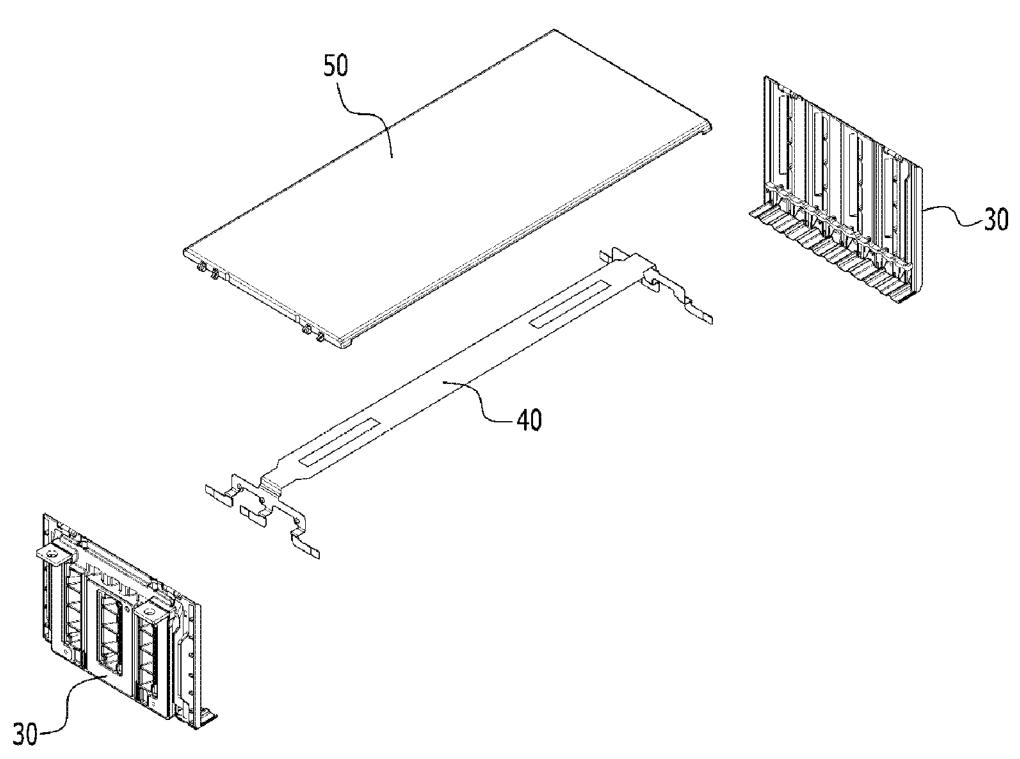
FIG. 2 is an exploded perspective view of a flexible printed circuit board cover and a flexible printed circuit board in FIG. 1.
Figure 4:
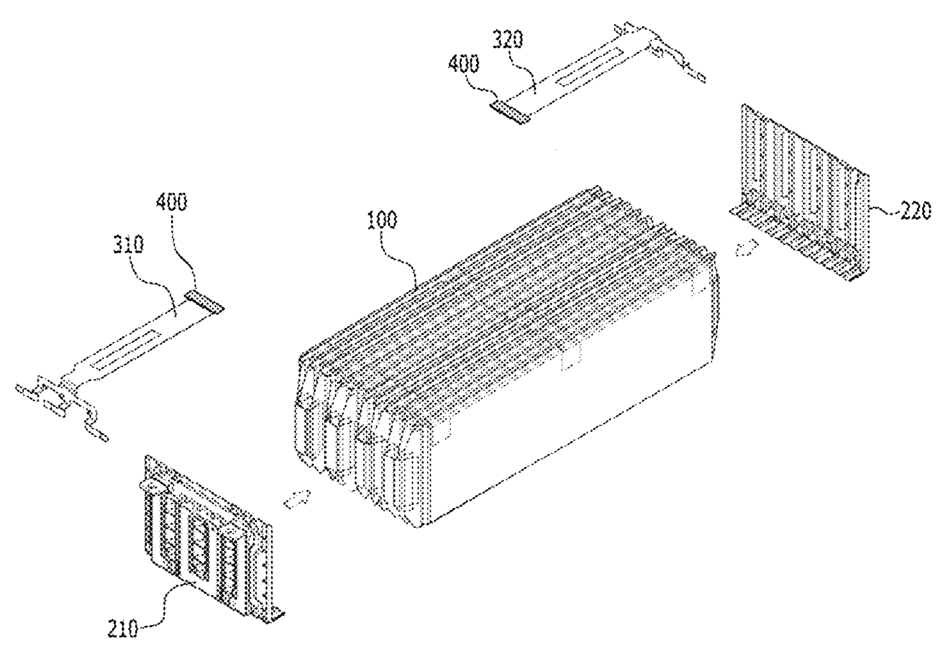
FIG. 4 is a perspective view showing a state before assembling the busbar frame and flexible printed circuit board of FIG. 3.

Referring to FIGS. 3 and 4, a battery module according to one embodiment of the present disclosure comprises a battery cell stack in which a plurality of battery cells 100 are stacked, busbar frames 200 formed respectively on both sides of the battery cell stack, and a flexible printed circuit board 300 connecting the busbar frames.

The battery cell 100 is a secondary battery, and may be composed of a pouch-type secondary battery. Such battery cells 100 may be configured of a plurality of cells, and the plurality of battery cells 100 may be stacked with each other so that they can be electrically connected to each other to form a battery cell stack. Each of the plurality of battery cells may include an electrode assembly, a battery case, and an electrode lead protruding from the electrode assembly.

The battery cell stack may include a battery cell fixing part 110 for fixing the plurality of battery cells 100 in a vertical direction at the center and both ends of the battery cell stack, as shown in FIG. 3 A busbar frame 200 may be formed respectively on front and rear surfaces of the battery cell stack. The busbar frame 200 includes a busbar and a cell connecting board, and may be formed to cover the front and rear surfaces of the battery cell stack so that the electrode leads of the plurality of battery cells 100 can be electrically connected.

The busbar frame 200 is formed of a first busbar frame 210 formed on one side of the battery cell stack and a second busbar frame 220 formed on the other side of the battery cell stack, and thus, can electrically connect the electrode leads on both sides of the battery cell stack, respectively.

The flexible printed circuit board (FPCB) 300 is formed to connect the first busbar frame 210 and the second busbar frame 220 to each other, and is disposed along a longitudinal direction of the battery cell 100 on an upper side of the battery cell stack. Such flexible printed circuit board 300 is configured to be electrically connected to the busbar provided in each of the first and second busbar frames 210 and 220 to sense a plurality of battery cells 100. Information on the battery cell 100 sensed through the flexible printed circuit board 300 in this way can be transmitted to a battery management system (BMS) to manage and control the plurality of battery cells 100.

The battery module according to one embodiment of the present disclosure is formed without a flexible printed circuit board cover which was conventionally used to protect the flexible printed circuit board. By removing the flexible printed circuit board cover, it is possible to reduce a height of the battery module by approximately 1.0 to 1.2 mm, including the thickness and tolerance of the flexible printed circuit board cover. Accordingly, it is possible to improve an energy density of the module through the compactness of the battery module, and further to reduce the cost required to manufacture the flexible printed circuit board cover.

However, if the flexible printed circuit board cover is removed as described above, the flexible printed circuit board is exposed to the outside, and thus, there is a risk that the flexible printed circuit board is damaged by an external object during the transportation of semi-finished products and the in-line process for mass production.

In order to solve the above problems, according to one embodiment of the present disclosure, an assembling method is adopted in which the flexible printed circuit board is separated into two, the busbar frame is first welded to the battery cell stack, and then two flexible printed circuit boards separated from each other are connected through a connector.

More specifically, the flexible printed circuit board 300 according to one embodiment of the present disclosure is composed of a first flexible printed circuit board part 310 and a second flexible printed circuit board part 320 which are separated from each other, and the first flexible printed circuit board part 310 and the second flexible printed circuit board part 320 may be connected to each other via a connector 400. The connector 400 may be formed at the center of the flexible printed circuit board 300 to mutually connect the first flexible printed circuit board part 310 and the second flexible printed circuit board part 320 which are formed with the same length.

Conventionally, the flexible printed circuit board and the busbar frames on both sides were coupled via a hinge structure, and, therefore, when the flexible printed circuit board and the busbar frames were mounted on the battery cell stack, the flexible printed circuit board was first seated on the upper surface of the battery cell stack, and then, the busbar frames and the flexible printed circuit board were installed in the way of coupling the busbar frames to both sides of the battery cell stack through hinge rotation. However, when being assembled through the hinge structure, the busbar frame rotating during the rotation installation thereof and the end of the electrode lead meet and interfere with each other during the installation thereof, and therefore, there was a problem that the electrode lead could be damaged. Further, there was also a problem that the assembling was not properly performed due to the deformation and separation of the hinge structure itself.

However, according to the embodiment of the present disclosure, the first busbar frame 210 and the second busbar frame 220 are vertically coupled to the front and rear surfaces of the battery cell stack, respectively, whereby the interference phenomenon between the electrode lead and the busbar frame can be prevented at the time of being assembled; the deformation and separation phenomenon due to the hinge structure can be prevented since the hinge structure is not applied; and the effect of reducing the cost can be achieved by eliminating the assembling process of the hinge structure.

As described above, after the first and second busbar frames 210 and 220 are vertically coupled to the battery cell stack, the first flexible printed circuit board part 310 may be connected to the first busbar frame 210 and the second flexible printed circuit board part 320 may be coupled to the second busbar frame 220, and the first flexible printed circuit board part 310 and the second flexible printed circuit board part 320 may be connected to each other via the connector 400.

The connector 400 couples the first flexible printed circuit board part 310 and the second flexible printed circuit board part 320, and may be formed to have a minimum size so as not to damage the battery cell 100. According to one embodiment of the present disclosure, the connector 400 is positioned on a battery cell fixing part 110 for fixing a plurality of battery cells in a vertical direction, whereby it may be formed to minimize physical impact between the connector 400 and the plurality of battery cells 100.

Hereinafter, a battery module according to another embodiment of the present disclosure will be described with reference to FIG. 5.

Figure 5:
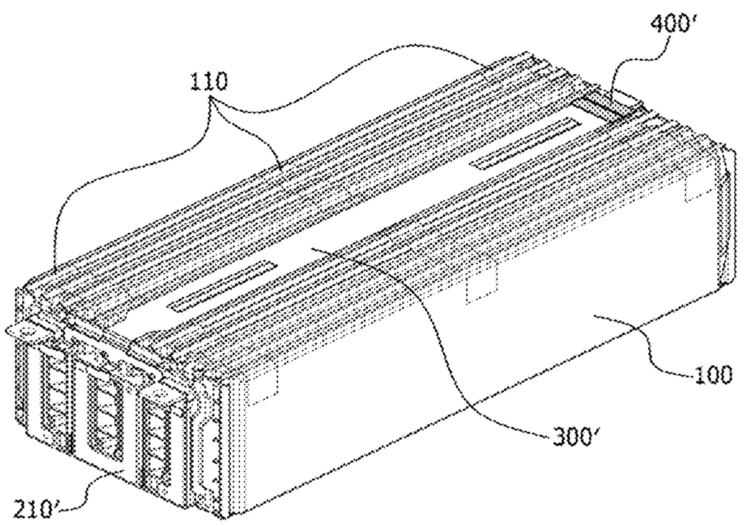
FIG. 5 is a perspective view showing a battery module according to another embodiment of the present disclosure.

FIG. 5 is a perspective view showing a battery module according to another embodiment of the present disclosure.

Referring to FIG. 5, in a battery module according to another embodiment of the present disclosure, a connector 400' is formed at any one of both ends of a flexible printed circuit board 300' to connect the two parts of the flexible printed circuit board parts.

However, a position of the connector 400' is not limited to the center or both ends as described above, and a structure is also possible in which the connector is formed at a portion of the flexible printed circuit board regardless of the position of the connector and connects two flexible printed circuit board parts separated into both sides by the connector at the center therebetween.

For contents other than the installation position of the connector 400', the contents of the battery module according to one embodiment of the present disclosure as described above are similarly applied.

The battery module as described above may be included in a battery pack. The battery pack may have a structure packed by gathering one or more of the battery modules according to the present embodiment and adding a battery management system (BMS) and a cooling device, etc. which manage the temperature or voltage of the battery, etc.

The battery pack comprising the same can be applied to various devices. Such a device may be applied to a vehicle such as an electric bicycle, an electric vehicle, or a hybrid vehicle, but the present disclosure is not limited thereto, and is applicable to various devices that can use a battery module, which also belongs to the scope of the present disclosure.

Although the invention has been shown and described with reference to the preferred embodiments, the scope of the present disclosure is not limited thereto, and numerous other modifications and embodiments can be devised by those skilled in the art that will fall within the spirit and scope of the principles of the invention described in the appended claims. Further, these modified embodiments should not be understood individually from the technical spirit or perspective of the present disclosure.

DESCRIPTION OF REFERENCE NUMERALS

100: battery cell
110: battery cell fixing part
200: busbar frame
210: first busbar frame
220: second busbar frame
300: flexible printed circuit board
310: first flexible printed circuit board part
320: second flexible printed circuit board part
400: connector

The invention claimed is:

1. A battery module comprising:

a battery cell stack in which a plurality of battery cells are stacked;

a first busbar frame and second busbar frame formed respectively on front and rear surfaces of the battery cell stack; and a flexible printed circuit board connecting the first busbar frame to the second busbar frame, wherein the flexible printed circuit board includes a first flexible printed circuit board part and a second flexible printed circuit board part which is separate from the first flexible printed circuit board part, and the first flexible printed circuit board part and the second flexible printed circuit board part are electrically connected to each other via a connector.

2. The battery module of claim 1, wherein the connector is formed at a center of the flexible printed circuit board to connect the first flexible printed circuit board part and the second flexible printed circuit board part.

3. The battery module of claim 1, wherein the connector is formed at one end of both the first flexible printed circuit board part and the second flexible printed circuit board part.

4. The battery module of claim 1, wherein the battery cell stack includes battery cell fixing parts for fixing the plurality of battery cells in a vertical direction at a center and both ends of the battery cell stack.

5. The battery module of claim 4, wherein the connector is located on one of the battery cell fixing parts.

6. The battery module of claim 1, wherein the connector is formed on opposite ends of each of the first and second flexible printed circuit board parts to connect the first and second flexible printed circuit board parts.

7. A method of manufacturing a battery module comprising the steps of:

coupling first and second busbar frames to front and rear surfaces of a battery cell stack, respectively;

coupling a first flexible printed circuit board part to the first busbar frame and coupling a second separate flexible printed circuit board part to the second busbar frame; and electrically connecting the first flexible printed circuit board part and the second flexible printed circuit board part via a connector.

8. The method of manufacturing a battery module according to claim 7, wherein in the step of coupling the first and second busbar frames to the battery cell stack, the first and second busbar frames are coupled to the front and rear surfaces of the battery cell stack in a vertical direction, respectively.

9. The method of manufacturing a battery module according to claim 7, wherein in the step of coupling the first and second busbar frames with the first and second flexible printed circuit board parts, respectively, the first and second busbar frames are coupled with the first and second flexible printed circuit board parts in a vertical direction, respectively.

10. The battery module of claim 1, wherein the battery module is formed without a flexible printed circuit board cover on the battery cell stack between the first busbar frame and the second busbar frame.

11. The battery module of claim 1, wherein the flexible printed circuit board is configured to be electrically connected to a busbar provided in the first busbar frame and to a busbar provided in the second busbar frame.

12. A battery module comprising: a battery cell stack in which a plurality of battery cells are stacked; a first busbar frame and second busbar frame formed respectively on front and rear surfaces of the battery cell stack; and a flexible printed circuit board connecting the first busbar frame to the second busbar frame, wherein the flexible printed circuit board includes a first flexible printed circuit board part and a second flexible printed circuit board part which is separate from the first flexible printed circuit board part, and the first flexible printed circuit board part and the second flexible printed circuit board part are electrically connected to each other via a connector, wherein the battery cell stack includes battery cell fixing parts for fixing the plurality of battery cells in a vertical direction at a center and both ends of the battery cell stack, and wherein the connector is located on one of the battery cell fixing parts.

13. The battery module of claim 12, wherein the connector is formed at a center of the flexible printed circuit board to connect the first flexible printed circuit board part and the second flexible printed circuit board part.

14. The battery module of claim 12, wherein the connector is formed at one end of both the first flexible printed circuit board part and the second flexible printed circuit board part.

15. The battery module of claim 12, wherein the connector is formed on opposite ends of each of the first and second flexible printed circuit board parts to connect the first and second flexible printed circuit board parts.

16. The battery module of claim 12, wherein the battery module is formed without a flexible printed circuit board cover on the battery cell stack between the first busbar frame and the second busbar frame.

17. The battery module of claim 12, wherein the flexible printed circuit board is configured to be electrically connected to a busbar provided in the first busbar frame and to a busbar provided in the second busbar frame.

* * * * *